US010693421B2

(12) United States Patent
Shimamoto et al.

(10) Patent No.: US 10,693,421 B2
(45) Date of Patent: *Jun. 23, 2020

(54) POWER AMPLIFICATION MODULE

(71) Applicant: Murata Manufacturing Co., Ltd., Kyoto (JP)

(72) Inventors: Kenichi Shimamoto, Kyoto (JP); Satoshi Tanaka, Kyoto (JP); Tadashi Matsuoka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/240,868

(22) Filed: Jan. 7, 2019

(65) Prior Publication Data

US 2019/0140596 A1 May 9, 2019

Related U.S. Application Data

(60) Continuation of application No. 15/629,146, filed on Jun. 21, 2017, now Pat. No. 10,211,783, which is a
(Continued)

(30) Foreign Application Priority Data

Mar. 20, 2014 (JP) .................................. 2014-059025
Dec. 17, 2014 (JP) .................................. 2014-255478

(51) Int. Cl.
*H03F 3/24* (2006.01)
*H03F 3/193* (2006.01)
(Continued)

(52) U.S. Cl.
CPC ......... *H03F 1/0222* (2013.01); *H03F 1/0211* (2013.01); *H03F 1/0261* (2013.01);
(Continued)

(58) Field of Classification Search
USPC .................................. 330/285, 296–297, 273
See application file for complete search history.

(56) References Cited

U.S. PATENT DOCUMENTS 6,873,211 B1 3/2005 Thompson et al.
7,005,923 B2* 2/2006 Noh ....................... H03F 1/0261
330/285

(Continued)

FOREIGN PATENT DOCUMENTS

JP H11-330866 A 11/1999
JP 2008-047978 A 2/2008
JP 2010-233171 A 10/2010

*Primary Examiner* — Hieu P Nguyen
(74) *Attorney, Agent, or Firm* — Pearne & Gordon LLP

(57) ABSTRACT

A power amplification module includes a first transistor which amplifies and outputs a radio frequency signal input to its base; a current source which outputs a control current; a second transistor connected to an output of the current source, a first current from the control current input to its collector, a control voltage generation circuit connected to the output and which generates a control voltage according to a second current from the control current; a first FET, the drain being supplied with a supply voltage, the source being connected to the base of the first transistor, and the gate being supplied with the control voltage; and a second FET, the drain being supplied with the supply voltage, the source being connected to the base of the second transistor, and the gate being supplied with the control voltage.

8 Claims, 14 Drawing Sheets

Related U.S. Application Data continuation of application No. 15/179,417, filed on Jun. 10, 2016, now Pat. No. 9,722,542, which is a division of application No. 14/640,341, filed on Mar. 6, 2015, now Pat. No. 9,397,618.

(51) Int. Cl.
*H03F 3/21* (2006.01)
*H03F 1/30* (2006.01)
*H03F 1/02* (2006.01)
*H03F 1/56* (2006.01)
*H03F 3/19* (2006.01)

(52) U.S. Cl.
CPC ............... *H03F 1/30* (2013.01); *H03F 1/56* (2013.01); *H03F 3/19* (2013.01); *H03F 3/193* (2013.01); *H03F 3/21* (2013.01); *H03F 3/245* (2013.01); *H03F 2200/108* (2013.01); *H03F 2200/222* (2013.01); *H03F 2200/318* (2013.01); *H03F 2200/387* (2013.01); *H03F 2200/411* (2013.01); *H03F 2200/447* (2013.01); *H03F 2200/451* (2013.01); *H03F 2200/555* (2013.01)

(56) References Cited

U.S. PATENT DOCUMENTS

| | | |
|---|---|---|
| 7,088,183 B2 | 8/2006 | Kuriyama |
| 7,576,612 B2 | 8/2009 | Nakamura et al. |
| 7,795,980 B2 | 9/2010 | Griffiths |
| 7,869,775 B2 | 1/2011 | Alon |
| 8,854,142 B2 | 10/2014 | Iizuka |
| 9,065,389 B2 * | 6/2015 | Ding ....................... H03F 1/302 |
| 9,413,313 B2 | 8/2016 | Banowetz |

* cited by examiner

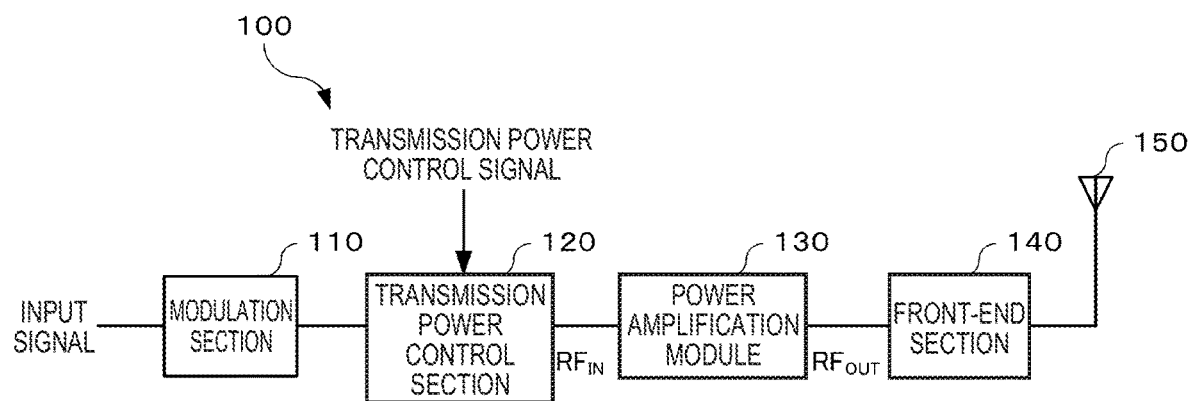
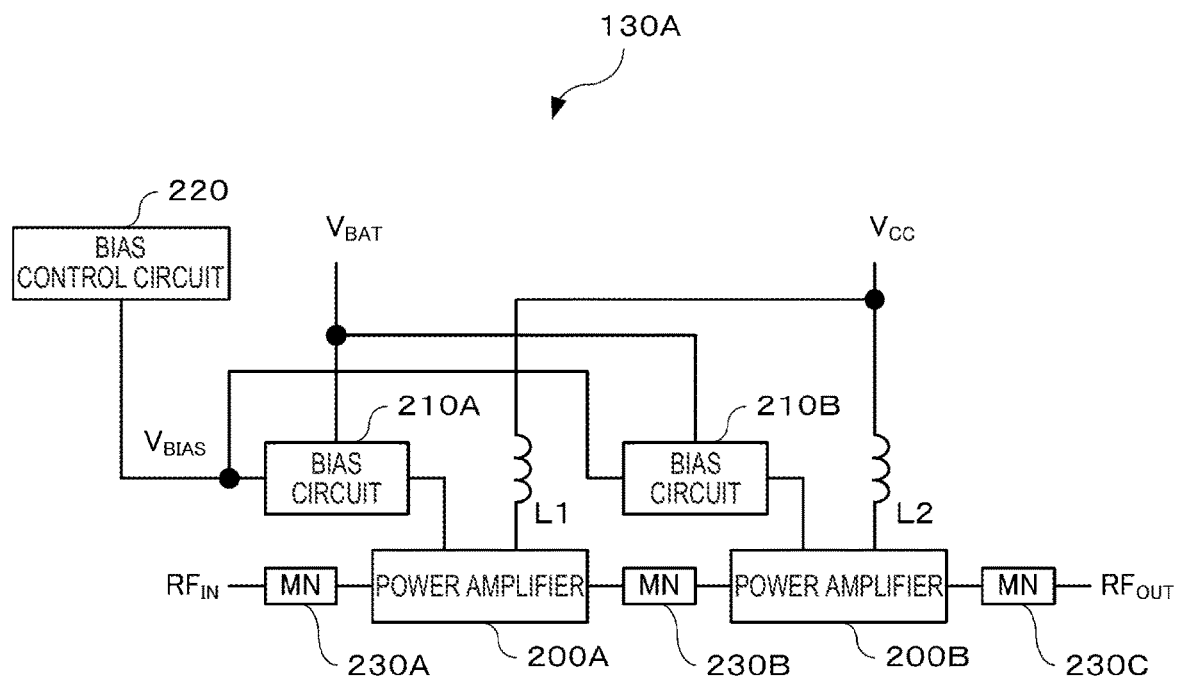

POWER AMPLIFICATION MODULE

This application is a continuation of U.S. patent application Ser. No. 15/629,146 filed Jun. 21, 2017, which is a continuation of U.S. patent application Ser. No. 15/179,417 filed on Jun. 10, 2016 which is a divisional of U.S. patent application Ser. No. 14/640,341 filed on Mar. 6, 2015 which claims priority from Japanese Patent Application No. 2014-059025 filed on Mar. 20, 2014 and Japanese Patent Application No. 2014-255478 filed on Dec. 17, 2014. The contents of these applications are incorporated herein by reference in their entireties.

BACKGROUND OF THE INVENTION

Field of the Invention

The present invention relates to a power amplification module.

Background Art

In a mobile communication device, such as a mobile phone, a power amplification module (power amplifier module) is used in order to amplify the power of a radio frequency (RF) signal to be transmitted to a base station. This power amplification module includes a power amplifier which amplifies the RF signal, and a bias circuit which supplies a bias current to a transistor constituting the power amplifier.

FIG. 10 is a diagram showing a configuration example of a power amplification module using an emitter follower type (common collector) bias circuit (for example, Patent Document 1). A bias circuit 1000 supplies a bias current to a bipolar transistor T100 constituting a power amplifier 1010, and has an emitter follower configuration. A battery voltage $V_{BAT}$ is applied to the collector of a bipolar transistor T110 constituting a bias circuit 1000.

In this configuration, if the bipolar transistors T100 and T110 are, for example, heterojunction bipolar transistors (HBT), the base-emitter voltage $V_{BE}$ of each bipolar transistor is about 1.3 V, and thus, the battery voltage $V_{BAT}$ of about 2.8 V is required in order to drive the bipolar transistor T110. For this reason, in general, the minimum voltage of the battery voltage $V_{BAT}$ is, for example, about 2.9 V.

On the other hand, in recent years, in a mobile communication device, such as a mobile phone, there has been demand for decreasing the minimum voltage of the battery voltage $V_{BAT}$ to about 2.5 V in order to improve a talking time or a communication time. However, in the configuration using the emitter follower (common collector) type bias circuit 1000 described above, the battery voltage $V_{BAT}$ of about 2.8 V is required, and thus, it is not possible to cope with this requirement.

Accordingly, as a configuration capable of operating a bias circuit with a lower battery voltage $V_{BAT}$, a configuration in which a FET is used in a bias circuit has been suggested. FIG. 11 is a diagram showing a configuration example of a power amplification module using a FET in a bias circuit (for example, Patent Document 2). As shown in FIG. 11, a FET (F100) is used in a bias circuit 1100 which supplies a bias current to a bipolar transistor T100 of a power amplifier 1010.

However, as disclosed in Patent Document 2, a FET is used in the bias circuit, thereby making the battery voltage $V_{BAT}$ for operating the bias circuit a low voltage. However, in the configuration disclosed in Patent Document 2, resistors R100 and R110 which output a control voltage to be applied to the gate of the FET (F100) are different in temperature characteristics from the bipolar transistor T100. For this reason, in the configuration disclosed in Patent Document 2, the gain of the power amplifier 1010 fluctuates with change in temperature.

CITATION LIST

Patent Documents

[Patent Document 1] JP11-330866 A
[Patent Document 2] JP2010-233171 A

SUMMARY OF THE INVENTION

The invention has been accomplished in consideration of this situation, and an object of the invention is to provide a power amplification module capable of achieving low-voltage driving and improving temperature characteristics.

A power amplification module according to an aspect of the invention includes a first bipolar transistor which amplifies and outputs a radio frequency signal input to the base of the first bipolar transistor, a current source which outputs a control current, a second bipolar transistor which is connected to an output terminal of the current source, a first current out of the control current being input to the collector of the second bipolar transistor, a control voltage generation circuit which is connected to the output terminal of the current source and generates a control voltage according to a second current out of the control current, a first FET, the drain of the first FET being supplied with a power supply voltage, the source of the first FET being connected to the base of the first bipolar transistor, and the gate of the first FET being supplied with the control voltage, and a second FET, the drain of the second FET being supplied with the power supply voltage, the source of the second FET being connected to the base of the second bipolar transistor, and the gate of the second FET being supplied with the control voltage.

According to the invention, it is possible to provide a power amplification module capable of achieving low-voltage driving and improving temperature characteristics.

BRIEF DESCRIPTION OF THE DRAWINGS

FIG. 1 is a diagram showing a configuration example of a transmission unit including a power amplification module according to an embodiment of the invention.

FIG. 2 is a block diagram showing the configuration of a power amplification module.

DESCRIPTION OF THE PREFERRED EMBODIMENTS

Figure 3:
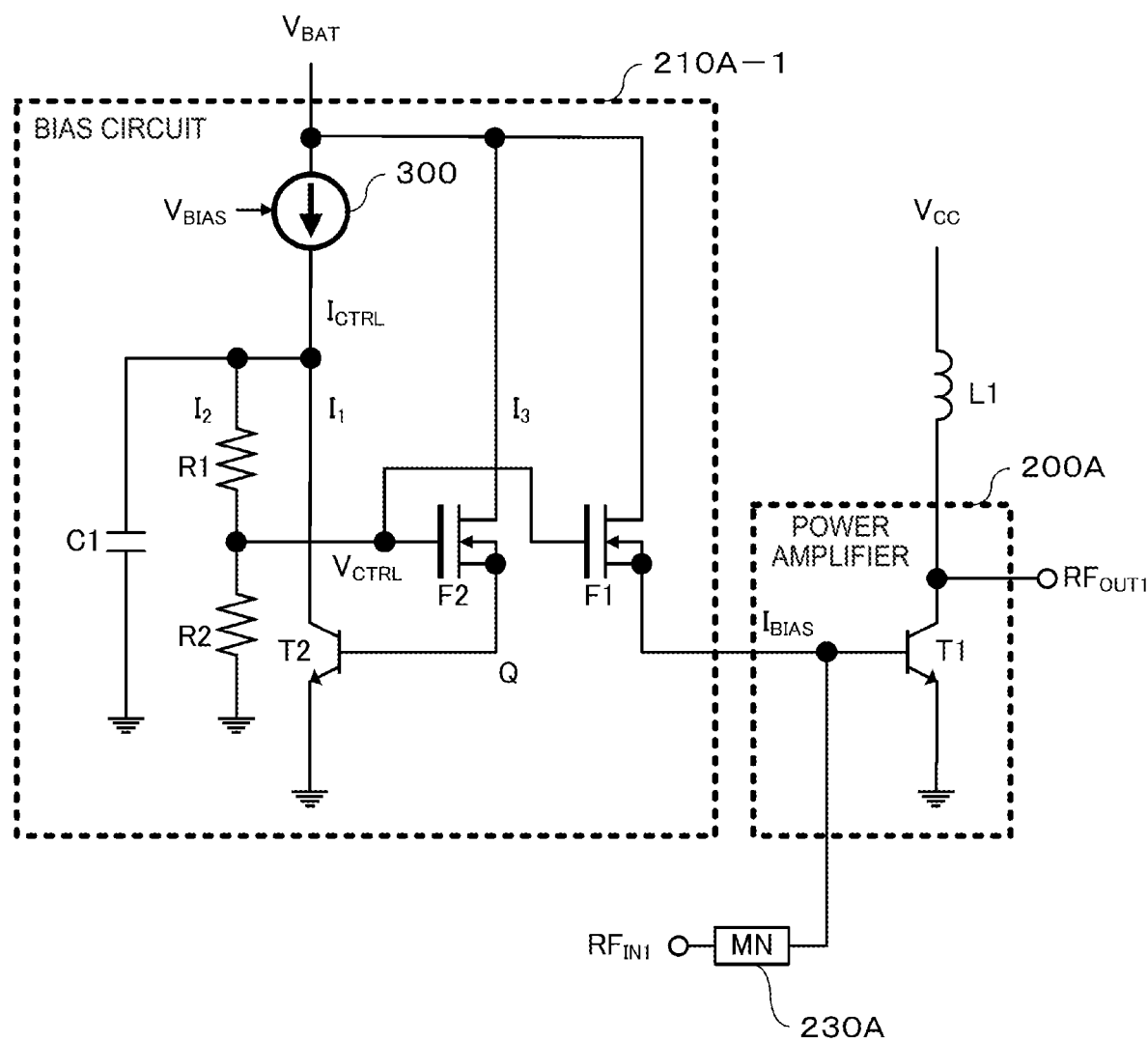
FIG. 3 is a diagram showing an example of the configurations of a power amplifier and a bias circuit.

Hereinafter, embodiments of the invention will be described referring to the drawings. FIG. 1 is a diagram showing the configuration example of a transmission unit 100 including a power amplification module 130. The transmission unit 100 is, for example used to transmit various signals, such as sound or data, to a base station from a mobile communication device, such as a mobile phone. Although the mobile communication device includes a reception unit which receives signals from the base station, description of the reception unit will be omitted.

As shown in FIG. 1, the transmission unit 100 includes a modulation section 110, a transmission power control section 120, a power amplification module 130, a front-end section 140, and an antenna 150.

The modulation section 110 modulates an input signal based on a modulation system, such as high speed uplink packet access (HSUPA) or long term evolution (LTE), and generates an RF signal for radio transmission. The frequency of the RF signal is, for example, about hundreds of MHz to several GHz.

The transmission power control section 120 adjusts the power of the RF signal based on a transmission power control signal and outputs the RF signal. The transmission power control signal is generated based on, for example, an adaptive power control (APC) signal transmitted from the base station. For example, the base station measures a signal from the mobile communication device, thereby transmitting the APC signal to the mobile communication device as a command to adjust transmission power in the mobile communication device to an appropriate level.

The power amplification module 130 amplifies the power of the RF signal ($RF_{IN}$) output from the transmission power control section 120 to a level necessary for transmission to the base station and outputs an amplified signal ($RF_{OUT}$).

The front-end section 140 performs filtering on the amplified signal, switching between the amplified signal and the reception signal received from the base station, or the like. The amplified signal output from the front-end section 140 is transmitted to the base station through the antenna 150.

FIG. 2 is a block diagram showing the configuration of a power amplification module 130A which is an example of the power amplification module 130. As shown in FIG. 2, the power amplification module 130A includes power amplifiers 200A and 200B, bias circuits 210A and 210B, a bias control circuit 220, matching circuits (MN: Matching Networks) 230A, 230B, and 230C, and inductors L1 and L2.

The power amplifiers 200A and 200B amplify the input RF signal and output the amplified signal. In the power amplification module 130A, the power amplifier 200A becomes an initial-stage (drive-stage) amplifier, and the power amplifier 200B becomes a back-stage (power-stage) amplifier. In the configuration shown in FIG. 2, although the power amplifiers are provided in a two-stage configuration, a power amplifier may be provided in a single-stage configuration or power amplifiers may be provided in a three or more-stage configuration.

The bias circuits 210A and 210B supply a bias current to the power amplifiers 200A and 200B based on a bias control voltage $V_{BIAS}$ supplied from the bias control circuit 220.

The bias control circuit 220 outputs the bias control voltage $V_{BIAS}$ for controlling the bias current to the bias circuits 210A and 210B. The bias control circuit 220 can adjust the output level of the bias control voltage $V_{BIAS}$ in order to vary the gains of the power amplifiers 200A and 200B.

The matching circuits 230A, 230B, and 230C are provided for impedance matching between the front and back circuits, and can be configured using, for example, a capacitor or an inductor.

FIG. 3 is a diagram showing examples of the configurations of the power amplifier 200A and the bias circuit 210A. The configurations of the power amplifier 200B and the bias circuit 210B shown in FIG. 2 are the same as the configurations of the power amplifier 200A and the bias circuit 210A, and thus description thereof will be omitted.

As shown in FIG. 3, the power amplifier 200A includes a bipolar transistor T1. The bipolar transistor T1 is, for example, a HBT. In the bipolar transistor T1, a power supply voltage $V_{CC}$ is applied to the collector through an inductor L1, the emitter is grounded, and an RF signal ($RF_{IN1}$) is input to the base through the matching circuit 230A. The base of the bipolar transistor T1 is also supplied with a bias current $I_{BIAS}$ from the bias circuit 210A. An amplified signal ($RF_{OUT1}$) of the RF signal ($RF_{IN1}$) is output from the collector of the bipolar transistor T1.

A bias circuit 210A-1 which is an example of the bias circuit 210A includes a current source 300, a bipolar transistor T2, resistors R1 and R2, FETs (F1, F2), and a capacitor C1.

The current source 300 generates a control current $I_{CTRL}$ according to the bias control voltage $V_{BIAS}$ using the battery voltage $V_{BAT}$ as a power supply voltage.

In the bipolar transistor T2, the collector is connected to an output terminal of the current source 300, and the emitter is grounded. A current $I_1$ which is a part of the control current $I_{CTRL}$ output from the current source 300 is input to the collector of the bipolar transistor T2. Similarly to the bipolar transistor T1, the bipolar transistor T2 is, for example, a HBT. The bipolar transistor T2 can have a size smaller than the bipolar transistor T1. The size of the bipolar transistor refers to an area occupied by the number of fingers of the transistor.

The resistor R1 and the resistor R2 connected in series are connected to the output terminal of the current source 300. A current $I_2$, which is a part of the control current $I_{CTRL}$ output from the current source 300, is input to the resistor R1 and the resistor R2. The resistors R1 and R2 constitute a control voltage generation circuit which generates a control voltage $V_{CTRL}$ according to the current $I_2$.

In the FET F1, the drain is supplied with the battery voltage $V_{BAT}$ as a power supply voltage, the source is connected to the base of the bipolar transistor T1, and the gate is supplied with the control voltage $V_{CTRL}$. In the FET F2, the drain is supplied with the battery voltage $V_{BAT}$ as a power supply voltage, the source is connected to the base of the bipolar transistor T2, and the gate is supplied with the control voltage $V_{CTRL}$. The FETs (F1, F2) can be depletion type FETs. The FET F2 can have a size smaller than the FET F1. The size of the FET refers to an occupancy area of a gate width and a gate length.

In the capacitor C1, one end is connected to the output terminal of the current source 300, and the other end is grounded.

In the bias circuit 210A-1 having this configuration, the bias current $I_{BIAS}$ is supplied from the source of the FET F1 to the base of the bipolar transistor T1. Hereinafter, the operation of the bias circuit 210A-1 will be described.

The FETs (F1, F2) and the bipolar transistor T2 operate with the control current $I_{CTRL}$ from the current source 300. If the potential of point Q (the base potential of the bipolar transistor T2) shown in FIG. 3 rises with the operation of the FET F2, the current $I_1$ flowing in the bipolar transistor T2 increases. If the current $I_1$ increases, the current $I_2$ flowing in the resistors R1 and R2 decreases. If the current $I_2$ decreases, the control voltage $V_{CTRL}$ falls. If the control voltage $V_{CTRL}$ falls, a current $I_3$ flowing in the FET F2 decreases, and the current $I_2$ flowing in the bipolar transistor T2 decreases. If the current $I_1$ decreases, the current $I_2$ flowing in the resistors R1 and R2 increases. If the current $I_2$ increases, the control voltage $V_{CTRL}$ rises. If the control voltage $V_{CTRL}$ rises, the current $I_3$ flowing in the FET F2 increases, and the current $I_1$ flowing in the bipolar transistor T2 increases.

In this way, in the bias circuit 210A-1, a closed loop operation is performed, and the control voltage $V_{CTRL}$ settles at a certain point. The bias current $I_{BIAS}$ according to the control voltage $V_{CTRL}$ is output from the source of the FET F1. Accordingly, the bias current $I_{BIAS}$ becomes a current according to the bias control voltage $V_{BIAS}$.

In this closed loop, the control voltage $V_{CTRL}$ supplied to the gate of the FET F1 changes according to the temperature characteristics of the bipolar transistor T2 and the FET F2. Accordingly, the bias current $I_{BIAS}$ supplied to the bipolar transistor T1 changes according to the temperature characteristics of the bipolar transistor T2 and the FET F2. The temperature characteristics of the bipolar transistor T1 are the same as the temperature characteristics of the bipolar transistor T2. The temperature characteristics of the FET F1 are the same as the temperature characteristics of the FET F2. Accordingly, change in the bias current $I_{BIAS}$ according to the temperature characteristics of the bipolar transistor T2 and the FET F2 is also made according to the temperature characteristics of the bipolar transistor T1 and the FET F1. With this, it is possible to suppress fluctuation in gain of the power amplification module 130 due to change in temperature.

In the bias circuit 210A-1, since the FET F1 is used as a transistor connected to the base of the bipolar transistor T1, even if the battery voltage $V_{BAT}$ is about 2.5 V, the bias circuit 210A-1 is operable. When the FET F1 is a depletion type FET, even if the battery voltage $V_{BAT}$ is about 2.0 V, it is possible to operate the bias circuit 210A-1.

In FIG. 3, although the power amplifier 200A and the bias circuit 210A have been described, the same applies to the power amplifier 200B and the bias circuit 210B. Accordingly, the power amplification module 130A can be driven with the battery voltage $V_{BAT}$ which is a low voltage of about 2.5 V (or about 2.0 V), and can have improved temperature characteristics.

On the other hand, there is variation in threshold voltage $V_{TH}$ of the FETs (F1, F2) used in the bias circuit 210A-1 shown in FIG. 3. It is considered that this variation causes fluctuation in bias current $I_{BIAS}$ output from the FET F1 to the base of the bipolar transistor T1, and also causes fluctuation in gain of the power amplification module 130A.

Figure 4:
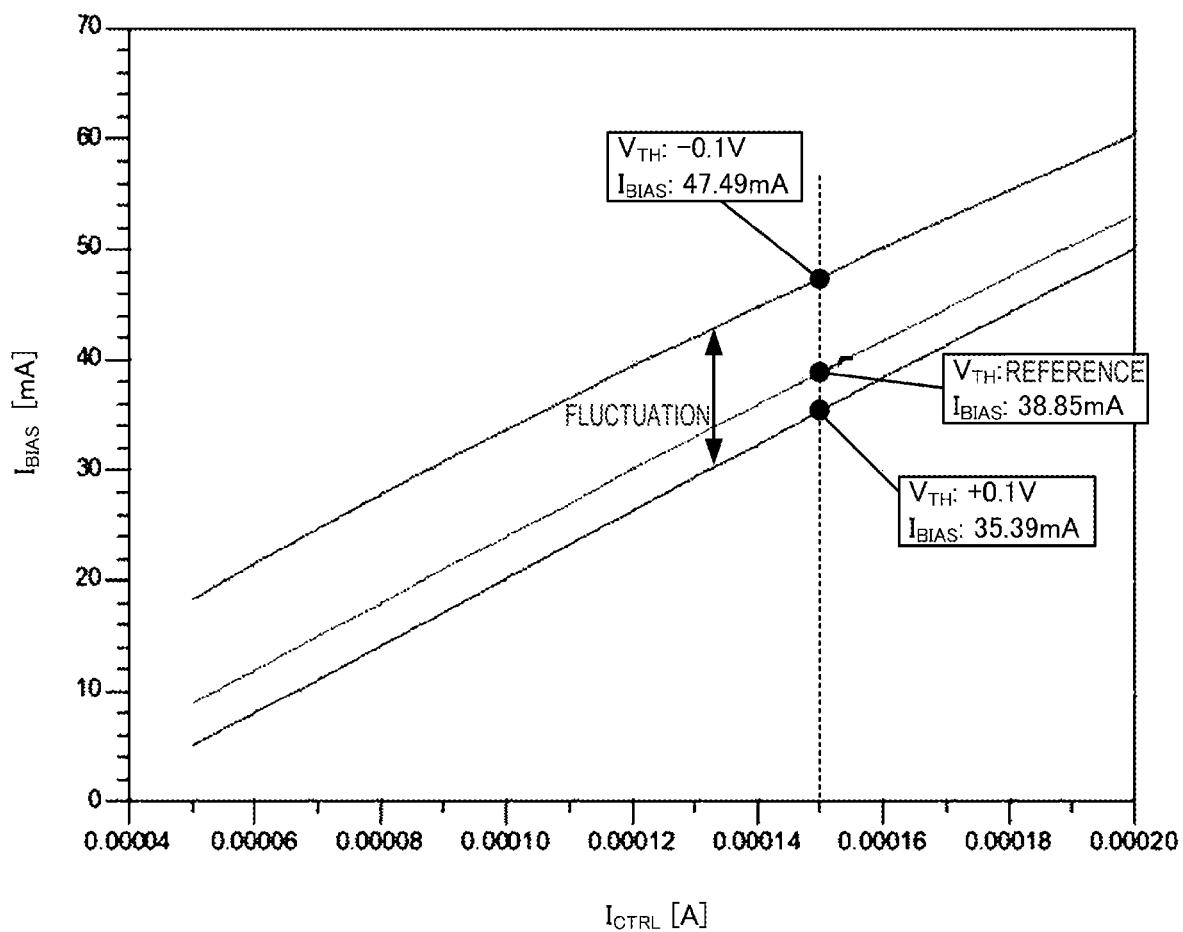
FIG. 4 is a simulation result showing an example of fluctuation in bias current $I_{BIAS}$ due to variation in threshold voltage $V_{TH}$ of FETs in a bias circuit.

FIG. 4 is a simulation result showing an example of fluctuation in bias current $I_{BIAS}$ due to variation in threshold voltage $V_{TH}$ of the FETs (F1, F2) in the bias circuit 210A-1 shown in FIG. 3. In FIG. 4, the horizontal axis represents the control current $I_{CTRL}$ (A) which is output from the current source 300, and the vertical axis represents the bias current $I_{BIAS}$ (mA). In the example shown in FIG. 4, when the threshold voltage $V_{TH}$ is increased or decreased from the reference by 0.1 V, fluctuation of about 10 mA occurs in the bias current $I_{BIAS}$.

In order to reduce the influence of variation in threshold voltage $V_{TH}$ of the FETs (F1, F2), increasing the one-round loop gain G in the above-described closed loop when viewed from the Q point in the bias circuit 210A-1 may be considered.

If the gain of the bipolar transistor T2 is Q, the emitter resistance of the bipolar transistor T2 is $R_e$, and the resistance values of the resistors R1 and R2 are respectively R1 and R2, a one-round loop gain G in the bias circuit 210A-1 shown in FIG. 3 is $G=(Q/R_e)\times(R1+R2)\times\{R2/(R1+R2)\}=(Q/R_e)\times R2$. Accordingly, if the resistance value of the resistor R2 is set to a large value, the one-round loop gain G can be increased. However, setting the resistance value of the resistor R2 to a large value leads to an increase in chip size.

Figure 5:
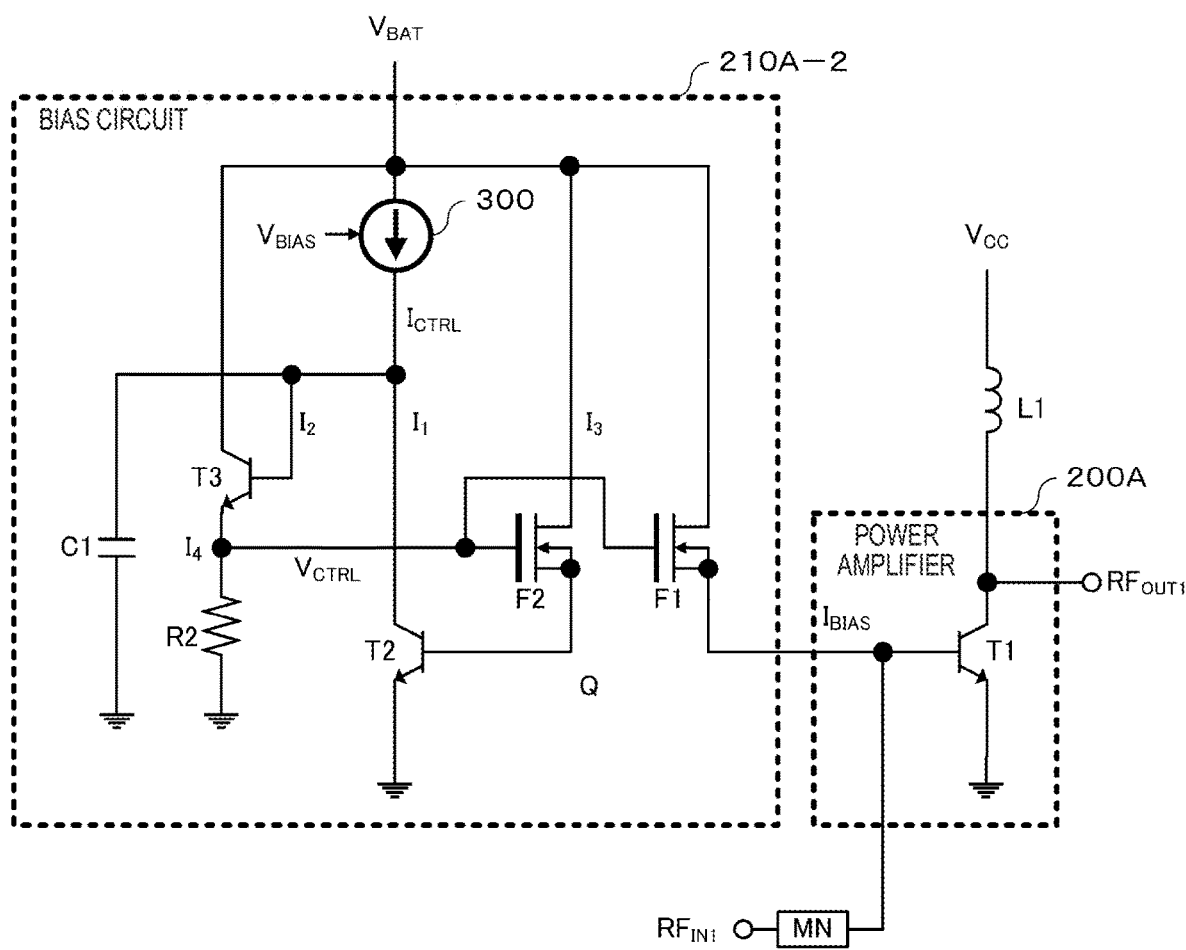
FIG. 5 is a configuration example for increasing a one-round loop gain in the bias circuit.

FIG. 5 is a configuration example for increasing the one-round loop gain G in the bias circuit 210A. A bias circuit 210A-2 shown in FIG. 5 includes a bipolar transistor T3 instead of the resistor R1 in the bias circuit 210A-1 shown in FIG. 3. Other configurations are the same as those shown in FIG. 3, and thus, description thereof will not be repeated. In the bipolar transistor T3, the collector is supplied with the battery voltage $V_{BAT}$, the emitter is connected to one end of the resistor R2, and the base is connected to the output terminal of the current source 300.

In the bias circuit 210A-2 shown in FIG. 5, the current $I_2$ which is a part of the control current $I_{CTRL}$ from the current source 300 is input to the base of the bipolar transistor T3. A current $I_4$, obtained by amplifying the current $I_2$, is output from the emitter of the bipolar transistor T3, and the current $I_4$ is converted to the control voltage $V_{CTRL}$ by the resistor R2. That is, the bipolar transistor T3 and the resistor R2 constitute a control voltage generation circuit which generates the control voltage $V_{CTRL}$ according to the current $I_2$.

If the current amplification factor of the bipolar transistor T3 is $hFE_{T3}$, the one-round loop gain G in the bias circuit 210A-2 shown in FIG. 5 is $G=(Q/re)\times R2 \times hFE_{T3}$. The current amplification factor $hFE_{T3}$ of the bipolar transistor T3 is, for example, a magnitude of about 100. Accordingly, in the bias circuit 210A-2 shown in FIG. 5, it is possible to increase the one-round loop gain G by the current amplification factor of the bipolar transistor T3 without setting the resistance value of the resistor R2 to a large value. With this, it is possible to suppress fluctuation in gain of the power amplification module 130A due to variation in threshold voltage $V_{TH}$ of the FETs (F1, F2).

Figure 6:
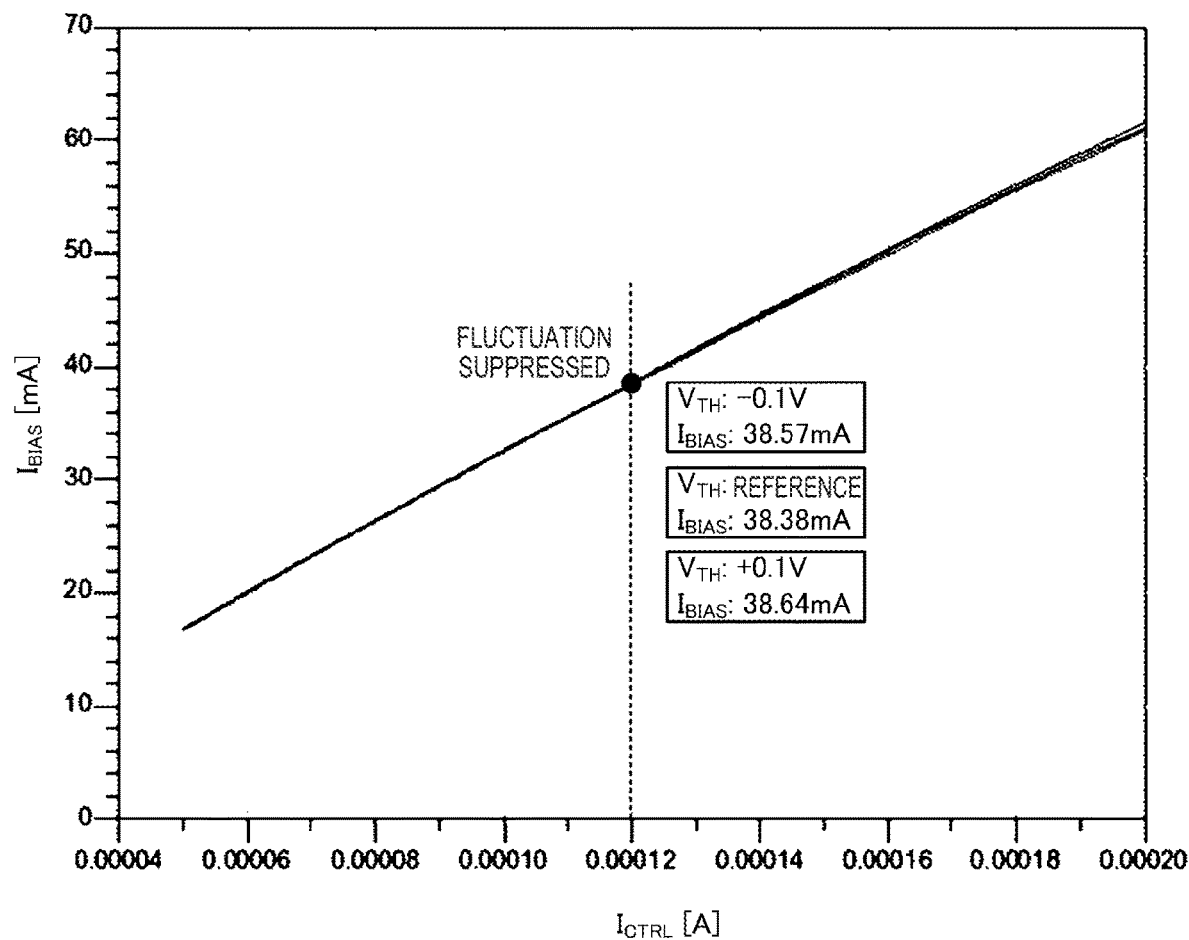
FIG. 6 is a simulation result showing an example of fluctuation in bias current $I_{BIAS}$ due to variation in threshold voltage $V_{TH}$ of FETs in a bias circuit.

FIG. 6 is a simulation result showing an example of fluctuation in bias current $I_{BIAS}$ due to variation in threshold voltage $V_{TH}$ of the FETs (F1, F2) in the bias circuit 210A-2 shown in FIG. 5. In FIG. 6, the horizontal axis represents the control current $I_{CTRL}$ (A) which is output from the current source 300, and the vertical axis represents the bias current $I_{BIAS}$ (mA). In the example shown in FIG. 6, when the threshold voltage $V_{TH}$ is increased or decreased from the reference by 0.1 V, the fluctuation width of the bias current $I_{BIAS}$ is less than 1 mA. In this way, it is understood from the simulation result that the use of the configuration shown in FIG. 5 can allow suppression of fluctuation in bias current $I_{BIAS}$ due to variation in threshold voltage $V_{TH}$ of the FETs (F1, F2).

Figure 7:
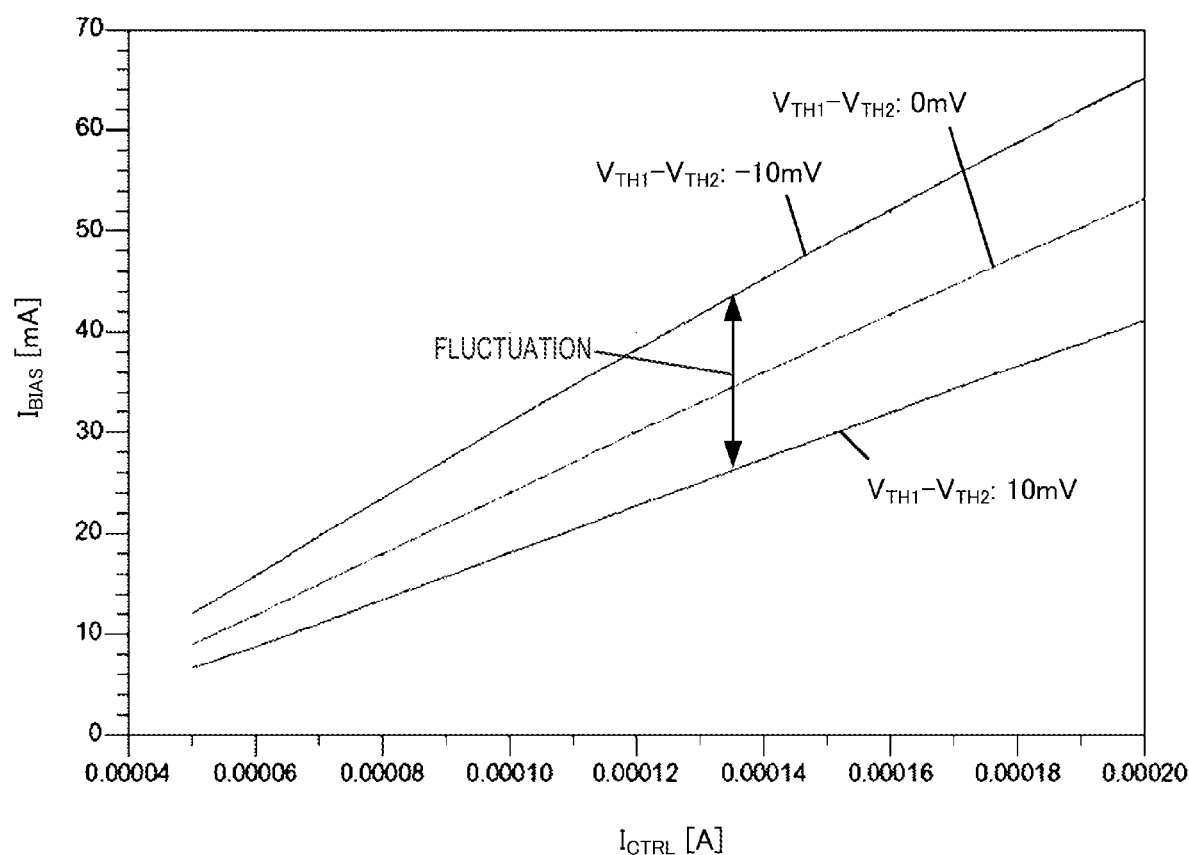
FIG. 7 is a simulation result showing an example of fluctuation in bias current $I_{BIAS}$ according to variation in pair property of threshold voltages of FETs in the bias circuit.

On the other hand, in the bias circuit 210A-2 shown in FIG. 5, variation in pair property may occur in the threshold voltage of the FETs (F1, F2). Variation in pair property of the threshold voltages of the FETs (F1, F2) is the difference between the threshold voltage $V_{TH1}$ of the FET F1 and the threshold voltage $V_{TH2}$ of the FET F2 in the same module. FIG. 7 is a simulation result showing an example of fluctuation in bias current $I_{BIAS}$ according to variation in pair property of the threshold voltages of the FETs (F1, F2) in the bias circuit 210A-2 shown in FIG. 5. In FIG. 7, the horizontal axis represents the control current $I_{CTRL}$ (A) which is output from the current source 300, and the vertical axis represents the bias current $I_{BIAS}$ (mA). In the example shown in FIG. 7, fluctuation of about 10 to 20 mA occurs in the bias current $I_{BIAS}$ due to variation (±10 mV) in pair property of the threshold voltages of the FETs (F1, F2).

Figure 8:
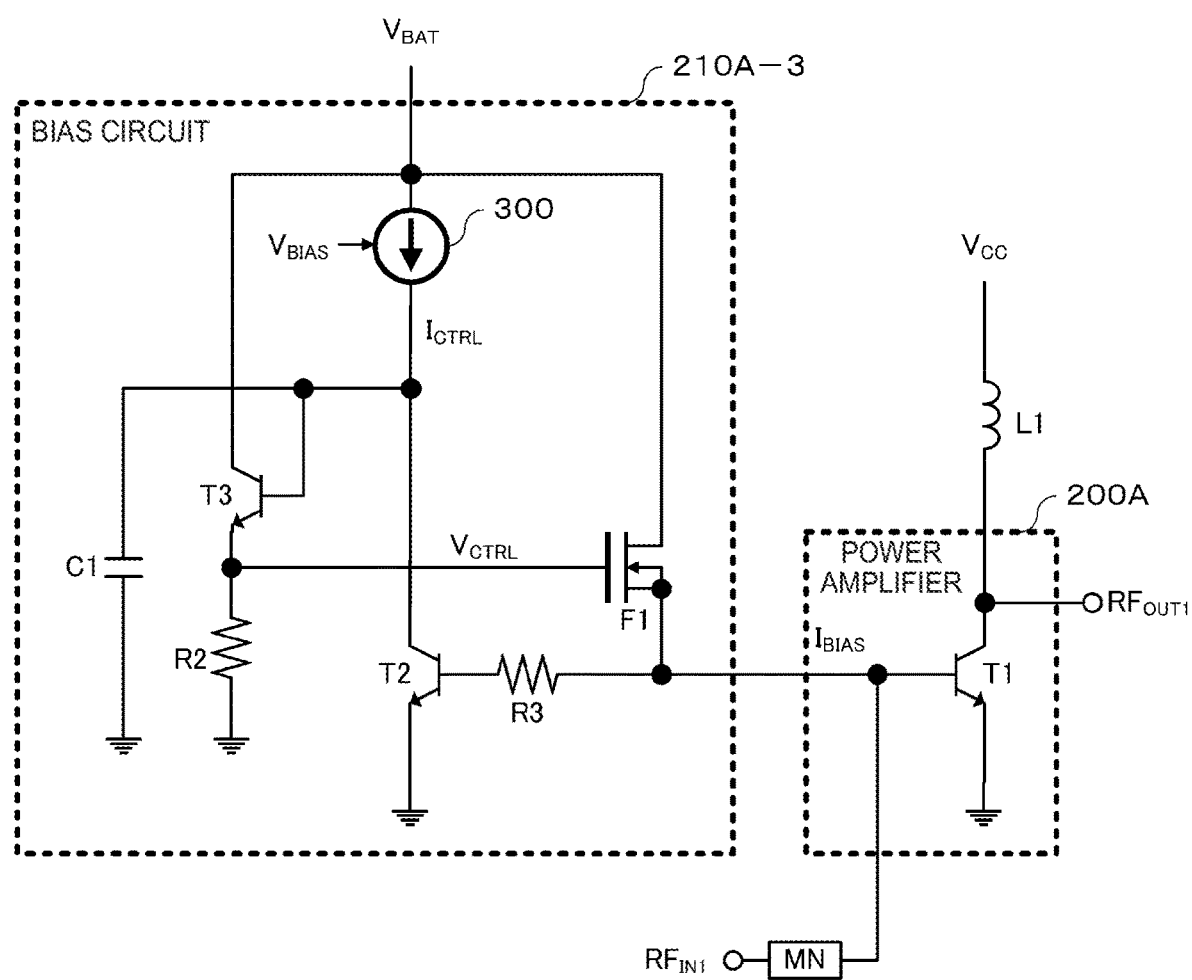
FIG. 8 is a diagram showing an example of the configuration of the bias circuit for suppressing an influence of variation in pair property of threshold voltages of FETs.

FIG. 8 is a diagram showing an example of the configuration of the bias circuit 210A for suppressing the influence of variation in pair property of the threshold voltages of the FETs (F1, F2). A bias circuit 210A-3 shown in FIG. 8 includes a resistor R3 instead of the FET F2 shown in FIG. 5. Other configurations are the same as those shown in FIG. 5, and thus, description will not be repeated. In the bias circuit 210A-3 shown in FIG. 8, the source of the FET F1 is connected to the base of the bipolar transistor T1 and is connected to one end of the resistor R3. The other end of the resistor R3 is connected to the base of the bipolar transistor T2. That is, in the bias circuit 210A-3 shown in FIG. 8, the FET F1 is used to generate the control voltage $V_{CTRL}$ by the closed loop and to supply the bias current $I_{BIAS}$ to the bipolar transistor T1. In the bias circuit 210-3 shown in FIG. 8, since only one FET is used, variation in pair property does not occur.

Figure 9:
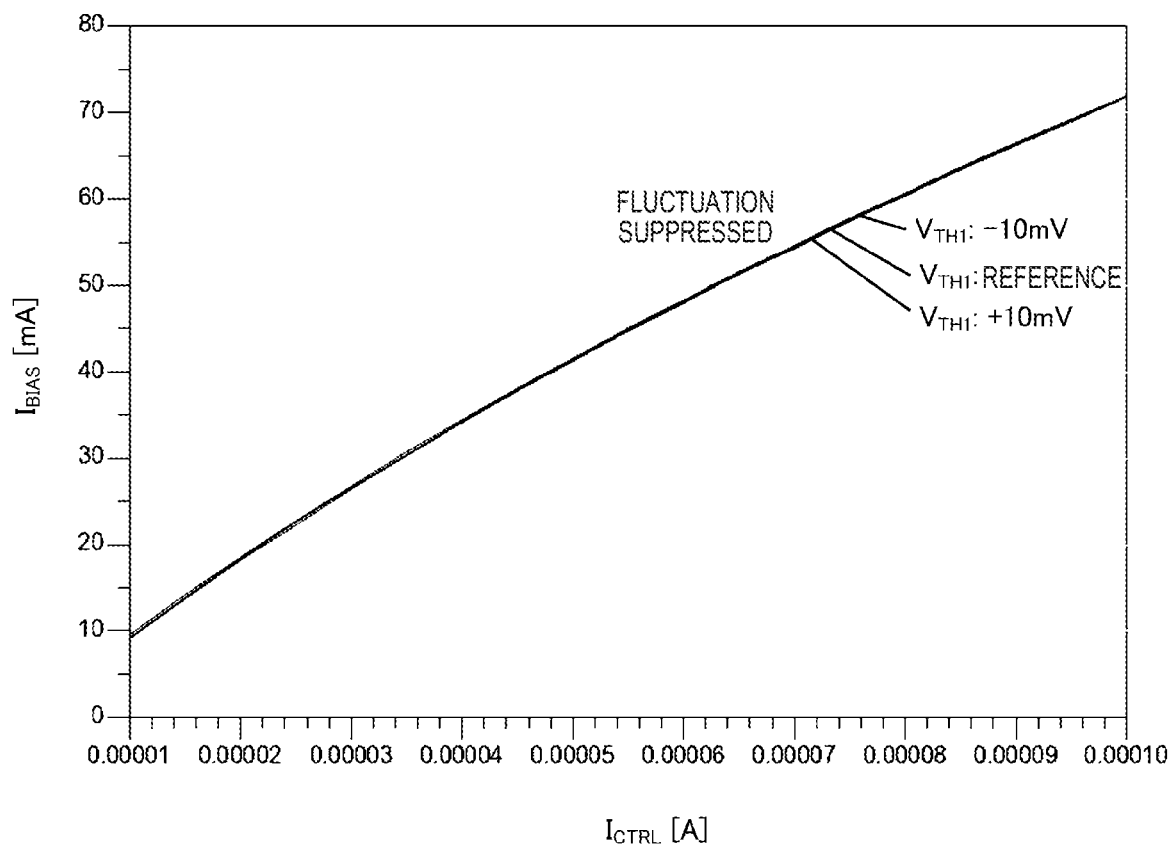
FIG. 9 is a simulation result showing an example of fluctuation in bias current $I_{BIAS}$ due to variation in threshold voltage $V_{TH1}$ of a FET in a bias circuit.
Figure 10:
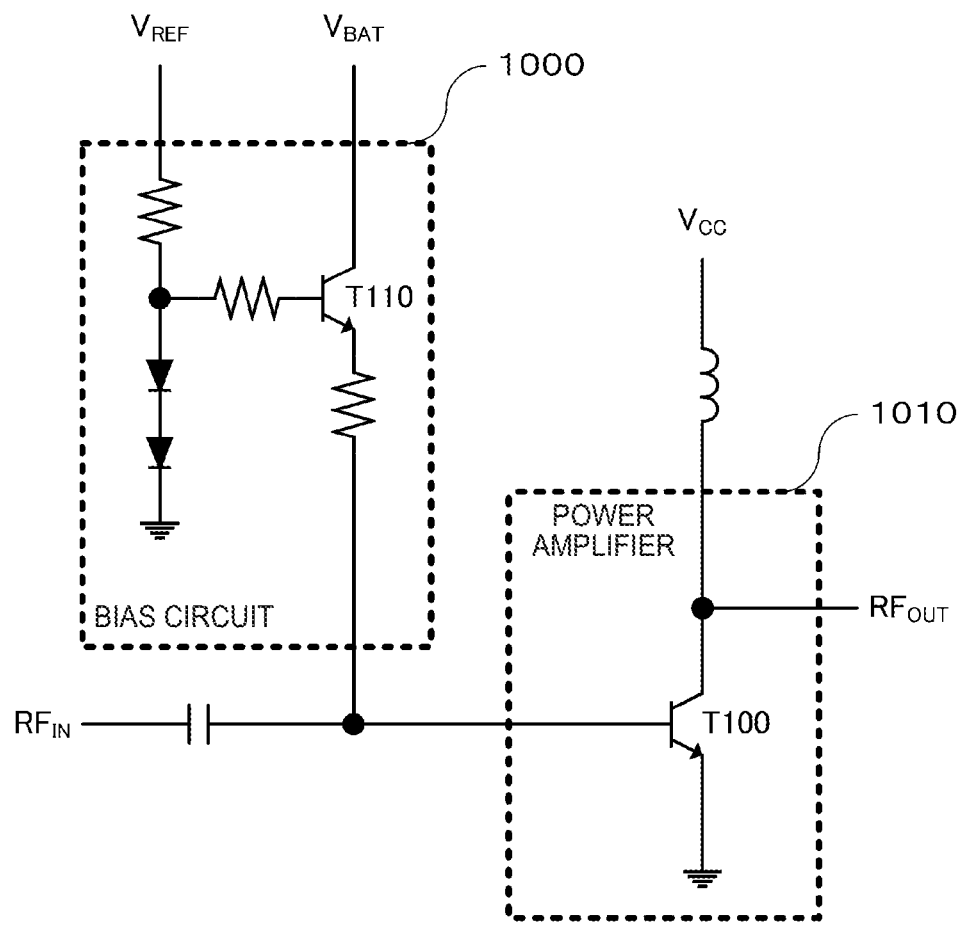
FIG. 10 is a diagram showing a configuration example of a power amplification module using an emitter follower (common collector) type bias circuit.
Figure 11:
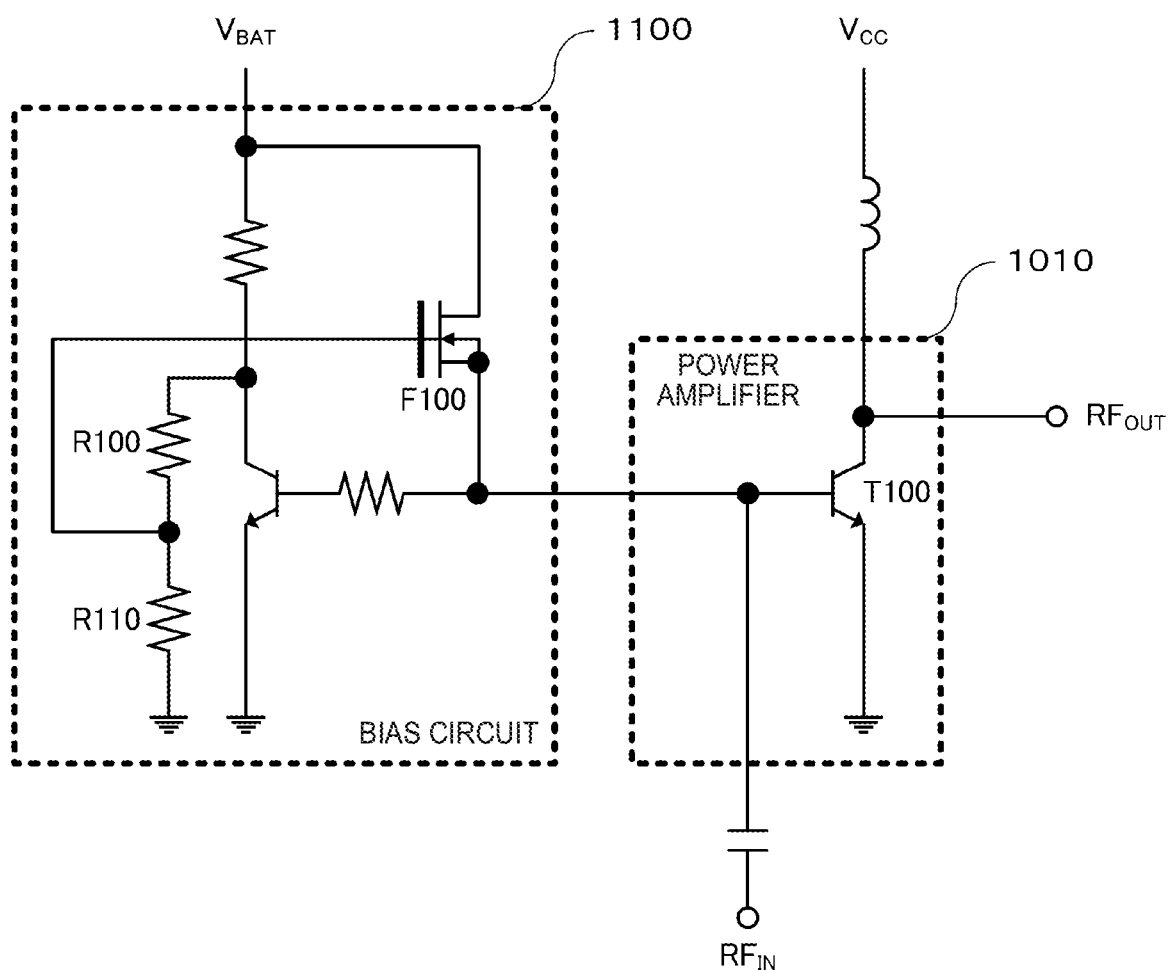
FIG. 11 is a diagram showing a configuration example of a power amplification module using a FET in a bias circuit.

FIG. 9 is a simulation result showing an example of fluctuation in bias current $I_{BIAS}$ due to variation in threshold voltage $V_{TH1}$ of the FET F1 in the bias circuit 210A-3 shown in FIG. 8. In FIG. 9, the horizontal axis represents the control current $I_{CTRL}$ (A) which is output from the current source 300, and the vertical axis represents the bias current $I_{BIAS}$ (mA). In the example shown in FIG. 9, when the threshold voltage $V_{TH1}$ is increased or decreased from the reference by 0.1 V, the fluctuation width of the bias current $I_{BIAS}$ is less than 1 mA. In this way, it is understood that the use of the configuration shown in FIG. 8 can allow suppression of fluctuation in bias current $I_{BIAS}$ due to variation in threshold voltage $V_{TH1}$ of the FET F1.

That is, in the bias circuit 210A-3 shown in FIG. 8, variation in pair property of the threshold voltages of the FETs (F1, F2) does not occur, and it is possible to suppress fluctuation in bias current $I_{BIAS}$ due to variation in threshold voltage $V_{TH1}$ of the FET F1. Accordingly, it is possible to suppress fluctuation in gain of the power amplification module 130A.

On the other hand, in the bias circuit 210A, for example, if a difference is generated between the base-emitter voltages of the bipolar transistors T1 and T2 or the threshold voltages of the FETs (F1, F2) due to manufacturing variation (variation in pair property), even when the control current $I_{CTRL}$ is substantially zero, a leak current may flow in the bipolar transistor T1.

Figure 12:
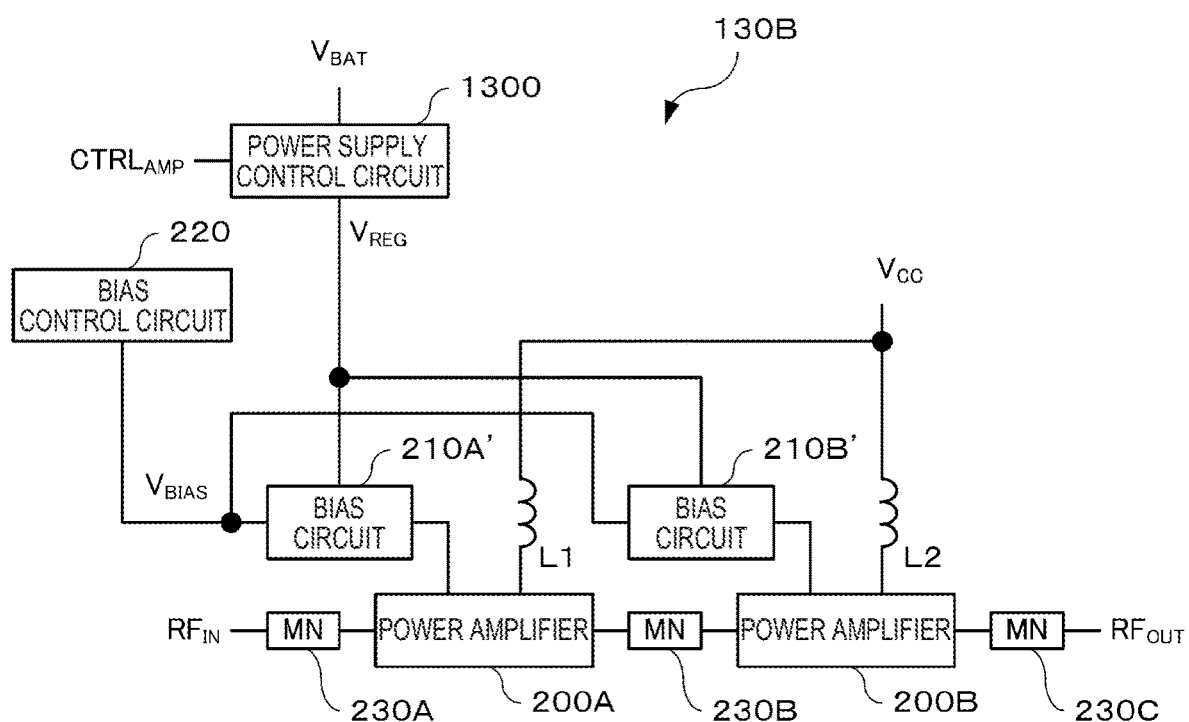
FIG. 12 is a diagram showing an example of the configuration of the power amplification module for suppressing a leak current.

FIG. 12 is a diagram showing an example of the configuration of the power amplification module 130 for suppressing a leak current. A power amplification module 130B shown in FIG. 12 includes bias circuits 210A' and 210B' instead of the bias circuits 210A and 210B in the power amplification module 130A shown in FIG. 2. The power amplification module 130B also includes a power supply control circuit 1300. In the power amplification module 130B, other configurations are the same as those of the power amplification module 130A, and thus, these configurations are represented by the same reference numerals and description thereof will not be repeated.

The bias circuits 210A' and 210B' are the same as the bias circuits 210A and 210B of the power amplification module 130A, except that a regulation voltage $V_{REG}$ is supplied as a power supply voltage. The details will be described below.

The power supply control circuit 1300 outputs the regulation voltage $V_{REG}$ based on the battery voltage $V_{BAT}$ and an amplification control signal $CTRL_{AMP}$. The amplification control signal $CTRL_{AMP}$ is a signal which indicates whether or not to perform the amplification of the RF signal in the power amplifiers 200A and 200B.

When the amplification control signal $CTRL_{AMP}$ indicates performing the amplification of the RF signal in the power amplifiers 200A and 200B, the power supply control circuit 1300 outputs the battery voltage $V_{BAT}$ as the regulation voltage $V_{REG}$.

When the amplification control signal $CTRL_{AMP}$ indicates not performing the amplification of the RF signal in the power amplifiers 200A and 200B, the power supply control circuit 1300 reduces the regulation voltage $V_{REG}$. Specifically, for example, the power supply control circuit 1300 sets the regulation voltage $V_{REG}$ to a zero level. In this case, the power supply control circuit 1300 may reduce the regulation voltage $V_{REG}$ to a level (for example, less than 2.0 V), at which the bipolar transistor T1 does not operate, instead of the zero level.

Figure 13:
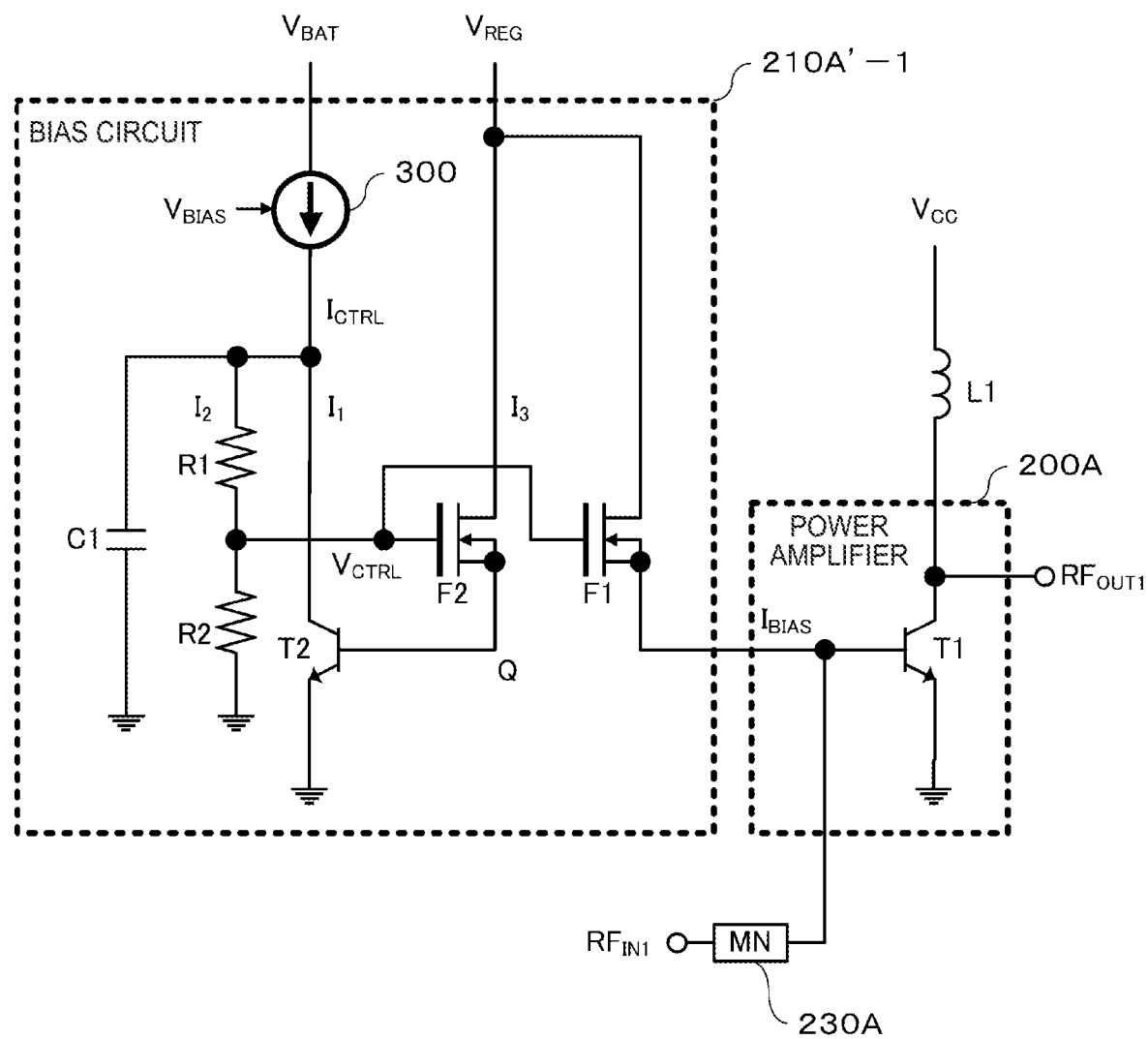
FIG. 13 is a diagram showing the configuration of an example bias circuit.

FIG. 13 is a diagram showing the configuration of a bias circuit 210A'-1 which is an example of the bias circuit 210A'. The configuration of the bias circuit 210B' is the same as that of the bias circuit 210A', and thus, description thereof will not be repeated. The same configurations as those in the bias circuit 210A-1 shown in FIG. 3 are represented by the same reference numerals, and description thereof will not be repeated.

As shown in FIG. 13, in the bias circuit 210A'-1, the regulation voltage $V_{REG}$ is supplied as a power supply voltage to the drains of the FETs (F1, F2). As described above, when the amplification of the RF signal is not performed in the power amplifier 200A, the regulation voltage $V_{REG}$ falls to, for example, the zero level. Accordingly, in this case, it is possible to suppress a leak current from flowing in the bipolar transistor T1.

Figure 14:
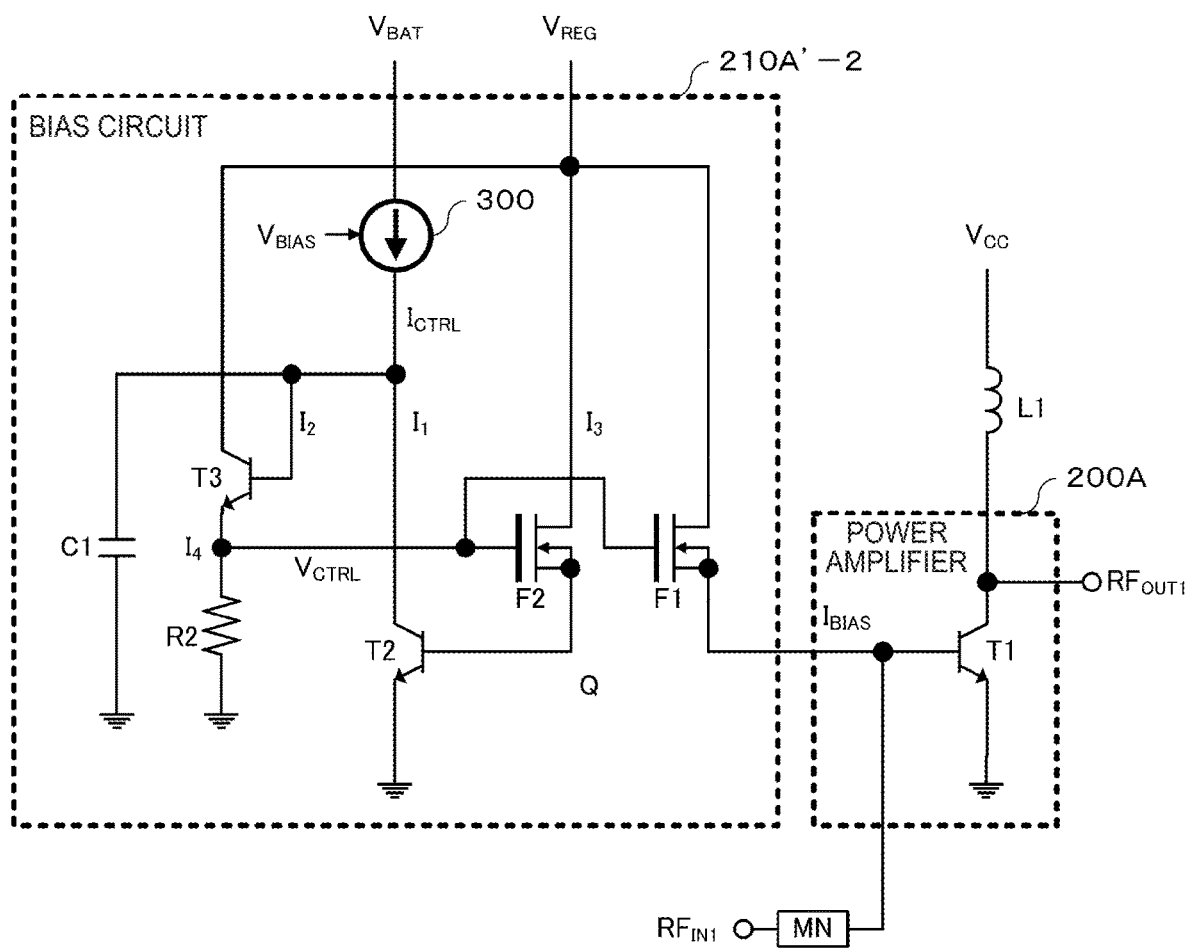
FIG. 14 is a diagram showing the configuration of an example bias circuit.
Figure 15:
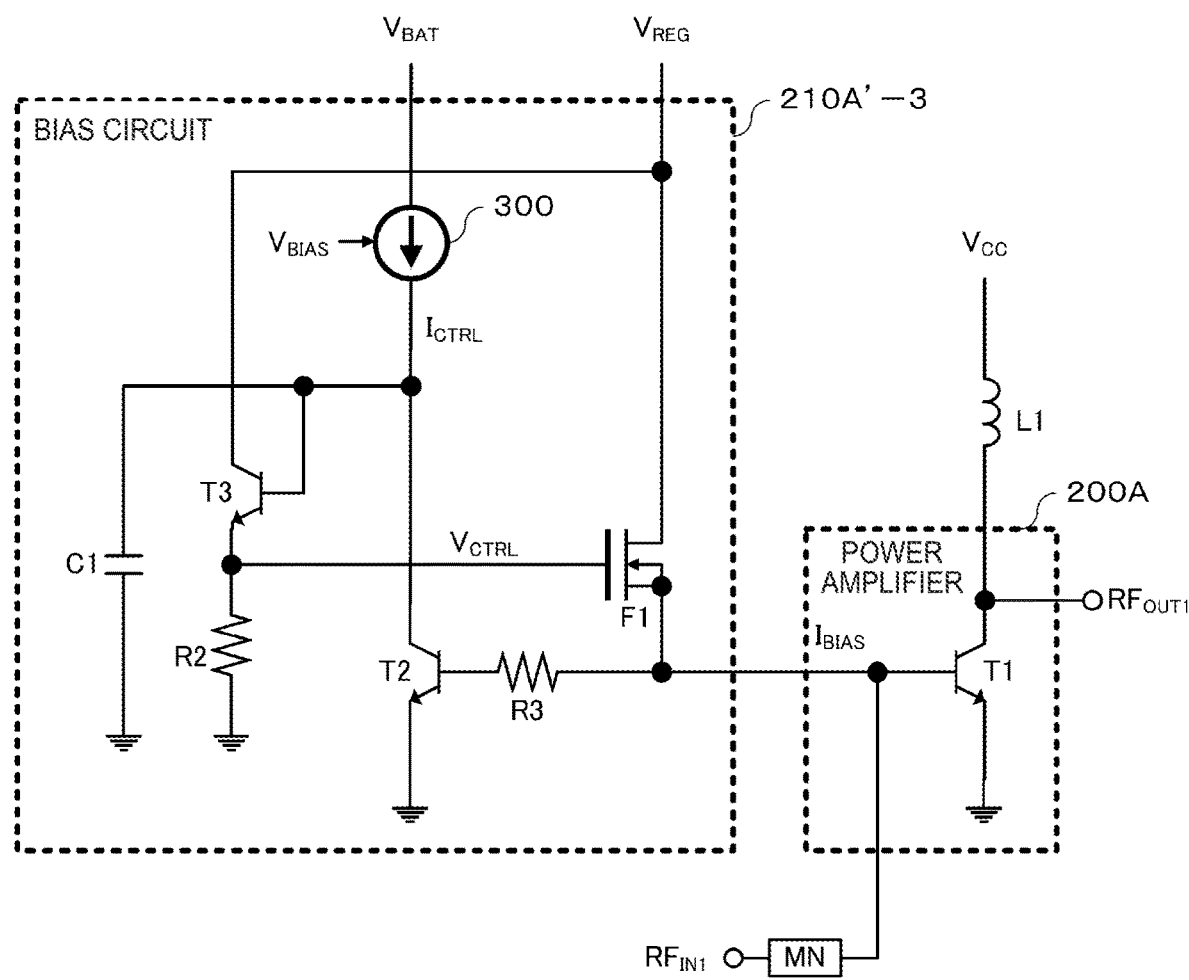
FIG. 15 is a diagram showing the configuration of an example bias circuit.

Similarly, the bias circuits 210A-2 and 210A-3 shown in FIGS. 5 and 8 can be changed to a configuration in which the regulation voltage $V_{REG}$ is supplied as a power supply voltage. Specifically, as an example of the bias circuit 210A', the configurations of bias circuits 210A'-2 and 210A'-3 shown in FIGS. 14 and 15 can be used.

As above, these embodiments have been described. According to the power amplification module 130 of this embodiment, the FET F1 can be used as a transistor for generating the bias current $I_{BIAS}$, whereby the battery voltage $V_{BAT}$ can be operable even at about 2.5 V. The control voltage $V_{CTRL}$ which is supplied to the gate of the FET F1 is controlled using the bipolar transistor T2 having the same temperature characteristics as the bipolar transistor T1 and the FET F2 having the same temperature characteristics as the FET F1, whereby it is possible to suppress fluctuation in gain of the power amplification module 130 due to change in temperature.

According to these embodiments, as shown in FIG. 5, the bipolar transistor T3 can be used as a circuit for generating the control voltage $V_{CTRL}$, whereby it is possible to increase the gain of the closed loop which generates the control voltage $V_{CTRL}$ and to reduce the influence of variation in threshold voltage of the FET. With this, it is possible to suppress fluctuation in gain of the power amplification module 130.

According to these embodiments, in the configuration shown in FIG. 3 or 5, the sizes of the bipolar transistor T2 and the FET F2 for generating the control voltage $V_{CTRL}$ can be made smaller than the sizes of the bipolar transistor T1 and the FET F1. With this, it is possible to reduce current consumption in a circuit which generates the control voltage $V_{CTRL}$.

According to these embodiments, the FETs (F1, F2) can be depletion type FETs, whereby it is possible to operate the power amplification module 130 even if the battery voltage $V_{BAT}$ is about 2.0 V.

According to these embodiments, as shown in FIG. 8, one FET F1 can be used to generate the control voltage $V_{CTRL}$ and to supply the bias current $I_{BIAS}$, whereby it is possible to suppress fluctuation in gain of the power amplification module 130 due to variation in pair property.

According to these embodiments, as shown in FIGS. 12 to 15, when the amplification of the RF signal is not performed in the power amplifiers 200A and 200B, the power supply voltage which is supplied to the FETs constituting the bias circuits 210A' and 210B' falls, whereby it is possible to suppress a leak current from flowing in the bipolar transistor T1.

The respective embodiments described above facilitate understanding of the invention and are not to be interpreted as limiting the invention. The invention may be altered and improved without departing from the gist of the invention, and equivalents are intended to be embraced therein. That is, those skilled in the art can appropriately modify the embodiments, and these modifications are also encompassed within the scope of the invention as long as the modifications include the features of the invention. For example, the components included in the embodiments and the arrangements, the materials, the conditions, the shapes, the sizes, and the like of the components are not limited to the illustrated ones and can be varied appropriately. The components included in the embodiments can be combined as long as the combination is technically possible, and the combined components are also encompassed within the scope of the invention as long as the combined components include the features of the invention.

DESCRIPTION OF REFERENCE NUMERALS 100 transmission unit
110 modulation section
120 transmission power control section
130 power amplification module
140 front-end section
150 antenna
200 power amplifier
210 bias circuit
220 bias control circuit
230 matching circuit
300 current source
T1 to T3 bipolar transistor
F1 to F2 FET
R1 to R3 resistor
C1 capacitor

What is claimed is:

1. A power amplification module comprising:
a first bipolar transistor which amplifies and outputs a radio frequency signal input to the base of the first bipolar transistor;
a current source which outputs a control current;
a second bipolar transistor which is connected to an output terminal of the current source, a first current out of the control current being input to the collector of the second bipolar transistor, the base of the second bipolar transistor being connected to the base of the first bipolar transistor;
a control voltage generation circuit which is connected to the output terminal of the current source and generates a control voltage according to a second current out of the control current; and
a first FET, the drain of the first FET being supplied with a power supply voltage, the source of the first FET being connected to the base of the first bipolar transistor, and the gate of the first FET being supplied with the control voltage,
wherein the control voltage generation circuit includes
a third bipolar transistor, the collector of the third bipolar transistor being supplied with the power supply voltage and the base of the third bipolar transistor being connected to the output terminal of the current source, and the control voltage is output from an emitter of the third bipolar transistor.

2. The power amplification module according to claim 1, wherein a size of the second bipolar transistor is smaller than a size of the first bipolar transistor.

3. The power amplification module according to claim 1, wherein the first FET is a depletion type FET.

4. The power amplification module according to claim 2, wherein the first FET is a depletion type FET.

5. The power amplification module according to claim 1, further comprising:
a power supply control circuit which, based on an amplification control signal instructing whether or not to perform the amplification of the radio frequency signal in the first bipolar transistor, reduces the power supply voltage when the amplification is not performed.

6. The power amplification module according to claim 2, further comprising:
a power supply control circuit which, based on an amplification control signal instructing whether or not to perform the amplification of the radio frequency signal in the first bipolar transistor, reduces the power supply voltage when the amplification is not performed.

7. The power amplification module according to claim 3, further comprising:
a power supply control circuit which, based on an amplification control signal instructing whether or not to perform the amplification of the radio frequency signal in the first bipolar transistor, reduces the power supply voltage when the amplification is not performed.

8. The power amplification module according to claim 4, further comprising:
a power supply control circuit which, based on an amplification control signal instructing whether or not to perform the amplification of the radio frequency signal in the first bipolar transistor, reduces the power supply voltage when the amplification is not performed.

* * * * *

UNITED STATES PATENT AND TRADEMARK OFFICE
CERTIFICATE OF CORRECTION

PATENT NO.         : 10,693,421 B2
APPLICATION NO.    : 16/240868
DATED              : June 23, 2020
INVENTOR(S)        : Kenichi Shimamoto It is certified that error appears in the above-identified patent and that said Letters Patent is hereby corrected as shown below:

In the Specification

Column 5, Line 24, "current $I_2$ flowing" should read -- current $I_1$ flowing --

Signed and Sealed this
First Day of December, 2020

Andrei Iancu
*Director of the United States Patent and Trademark Office*